(12) United States Patent
Sundar et al.

(10) Patent No.: US 7,190,870 B2
(45) Date of Patent: Mar. 13, 2007

(54) SEMICONDUCTOR NANOCRYSTAL COMPOSITE

(75) Inventors: Vikram C. Sundar, Stoneham, MA (US); Hans J. Eisler, Stoneham, MA (US); Moungi G. Bawendi, Boston, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 10/244,545

(22) Filed: Sep. 17, 2002

(65) Prior Publication Data

US 2003/0142944 A1 Jul. 31, 2003

Related U.S. Application Data

(60) Provisional application No. 60/322,466, filed on Sep. 17, 2001.

(51) Int. Cl.
*G02B 6/10* (2006.01)

(52) U.S. Cl. ........................................ 385/129; 385/141
(58) Field of Classification Search ......... 385/129–132, 385/141, 142, 144; 359/342, 344; 372/41, 372/43; 252/301.4 R, 301.6 F, 301.36, 62.3 GA, 252/62.3 ZB, 62.3 ZT, 62.3 V
See application file for complete search history.

(56) References Cited

U.S. PATENT DOCUMENTS

| | | | |
|---|---|---|---|
| 4,896,325 | A | 1/1990 | Coldren |
| 5,253,258 | A | 10/1993 | Lawandy |
| 5,260,957 | A | 11/1993 | Hakimi et al. |
| 5,262,357 | A | 11/1993 | Alivisatos et al. |
| 5,293,050 | A | 3/1994 | Chapple-Sokol et al. |

(Continued)

FOREIGN PATENT DOCUMENTS

| | | |
|---|---|---|
| JP | 01 176095 | 7/1989 |
| WO | WO 98/04740 | 2/1998 |
| WO | WO 98/19963 | 5/1998 |
| WO | WO 98/33070 | 7/1998 |
| WO | WO 98/36376 | 8/1998 |
| WO | WO 99/19515 | 4/1999 |
| WO | WO 99/26299 | 5/1999 |
| WO | WO 99/50916 | 10/1999 |
| WO | WO 00/17655 | 3/2000 |
| WO | WO 00/17656 | 3/2000 |
| WO | WO 00/27365 | 5/2000 |
| WO | WO 00/27436 | 5/2000 |
| WO | WO 00/28088 | 5/2000 |
| WO | WO 01/07689 | 2/2001 |
| WO | WO 01/71867 | 9/2001 |

OTHER PUBLICATIONS

U.S. Appl. No. 60/310,095.*
U.S. Appl. No. 60/309,898.*
U.S. Appl. No. 60/309,905.*
U.S. Appl. No. 60/309,979.*
U.S. Appl. No. 60/310,090.*
Alivisatos, "Perspectives on the Physical Chemistry of Semiconductor Nanocrystals", J. Phys. Chem., vol. 100, No. 31, pp. 13226–13239, (1996).
Alivisatos, Science, 271, pp. 933–937, (1996).
Arakawa et al., Appl. Phys. Lett. 1982, 40, 939.
Asada et al., *IEEE J. Quant. Electron.* 1986, 22, 1912.
Bawendi, et al,. "Luminescence properties of CdSe quantum crystallites: Resonance between interior and surface localized states", J. Chem. Phys., 96(2), pp. 946–954, (Jan. 1, 1992).

(Continued)

*Primary Examiner*—John D. Lee
*Assistant Examiner*—Mike Stahl
(74) *Attorney, Agent, or Firm*—Steptoe & Johnson LLP

(57) ABSTRACT

A composite including a plurality of semiconductor nanocrystals distributed in a metal oxide matrix can be used as an optical amplifier, a waveguide or a laser.

44 Claims, 5 Drawing Sheets

U.S. PATENT DOCUMENTS

| | | | |
|---|---|---|---|
| 5,308,804 A | | 5/1994 | Lee |
| 5,354,707 A | | 10/1994 | Chapple-Sokol et al. |
| 5,395,791 A | | 3/1995 | Cheng et al. |
| 5,422,489 A | | 6/1995 | Bhargava |
| 5,434,878 A | * | 7/1995 | Lawandy ..................... 372/43 |
| 5,492,080 A | | 2/1996 | Ohkawa et al. |
| 5,499,260 A | | 3/1996 | Takahashi et al. |
| 5,505,928 A | | 4/1996 | Alivisatos et al. |
| 5,515,393 A | | 5/1996 | Okuyama et al. |
| 5,525,377 A | | 6/1996 | Gallagher et al. |
| 5,537,000 A | | 7/1996 | Alivisatos |
| 5,541,948 A | | 7/1996 | Krupke et al. |
| 5,585,640 A | | 12/1996 | Huston et al. |
| 5,625,456 A | | 4/1997 | Lawandy |
| 5,674,698 A | | 10/1997 | Zarling et al. |
| 5,711,803 A | | 1/1998 | Pehnt et al. |
| 5,721,099 A | | 2/1998 | Still et al. |
| 5,736,330 A | | 4/1998 | Fulton |
| 5,747,180 A | | 5/1998 | Miller et al. |
| 5,751,018 A | | 5/1998 | Alivisatos et al. |
| 5,770,299 A | | 6/1998 | Dannenhauer et al. |
| 5,881,200 A | | 3/1999 | Burt |
| 5,985,353 A | | 11/1999 | Lawton et al. |
| 5,990,479 A | | 11/1999 | Weiss et al. |
| 6,207,229 B1 | | 3/2001 | Bawendi et al. |
| 6,251,303 B1 | | 6/2001 | Bawendi et al. |
| 6,322,901 B1 | | 11/2001 | Bawendi et al. |
| 6,337,117 B1 | | 1/2002 | Maenosono et al. |
| 6,506,342 B1 | | 1/2003 | Frankel |
| 6,512,172 B1 | * | 1/2003 | Salafsky et al. ............ 136/263 |
| 6,548,168 B1 | | 4/2003 | Mulvaney et al. |
| 6,548,171 B1 | | 4/2003 | Barbera-Guillem et al. |
| 6,611,640 B2 | * | 8/2003 | LoCasclo et al. ............. 385/27 |
| 6,690,871 B2 | * | 2/2004 | Lee et al. .................... 385/129 |
| 6,794,265 B2 | * | 9/2004 | Lee et al. .................... 438/409 |
| 2001/0038900 A1 | * | 11/2001 | Todori et al. .............. 428/64.4 |
| 2002/0110180 A1 | * | 8/2002 | Barney et al. .............. 374/161 |

OTHER PUBLICATIONS

Bruchez et al., "Semiconductor nanocrystals as fluorescent probes for biology," Cytometry, Supplement 9, p. 26, (Mar., 1998).

Bruchez et al., Science 1998, 281, 2013.

Butty et al., Appl. Phys. Lett. 1995, 67, 2672.

Chan et al., Science 1998, 281, 2016.

Colvin et al., "Light–emitting diodes made from cadmium selenide nanocrystals and a semiconducting polymer" Nature, 370(6488):354–357, (Aug. 4, 1994).

Correa–Duarte et al., "Stabilization of CdS semiconductor nanoparticles against photodegradation by a silica coating procedure," Chemical Physics Letters, 286, pp. 497–501 (1998).

Dabbousi et al., "(CdSe)ZnS Core–Shell Quantum Dots: Synthesis and Characterization of a Size Series of Highly Luminescent Nanocrystallites," The Journal of Physical Chemistry B, 101(46), pp. 9463–9475 (1997).

Dabbousi et al., "Electroluminescence from CdSe quantum–dot/polymer composites," Appl. Phys. Lett., 66 (11), pp. 1316–1318, (1995).

Danek et al., "Synthesis of Luminescent Thin–film CdSeZnSe Quantum Dot Composites Using CdSe Quantum Dots Passivity with an Over layer of ZnS," Chem. Mater., 8(1), pp. 173–180, (1996).

Empedocles, et al., "Photoluminescence Spectroscopy of Single CdSe Nanocrystallite Quantum Dots", Physical Review Letters, vol. 77, No. 18, pp. 3873–3876, (1996).

Empedocles, et al., Quantum–Confined Stark Effect in single CdSe Nanocrystallite Quantum Dots:, Science, vol. 278, pp. 2114–2117, (1997).

Gan, et al., "Enhanced Photoluminescence and Characterization of Mn–Doped ZnS Nanocrystallites Synthesized in Microemulsion", Langmuir, vol. 13, No. 24, pp. 6427–6431, (1997).

Gao et al., "Strongly Photoluminescent CdTe Nanocrystals by Proper Surface Modification," J. Phys. Chem., vol. 102, pp. 8360–8363, (1998).

Giessen et al., Phase Transitions 1999, 68, 59.

Gindele, et al., "Optical gain and high quantum efficiency of matrix–free, closely packed CdSe quantum dots", Appl. Phys. Lett., 71(15), pp. 2181–2183, (Oct. 13, 1997.

Green, et al., "Recent advances in the preparation of semiconductors as isolated nanometric particles; new routes to quantum dots", Chem. Commun., pp. 2235–2241, (1999).

Guha et al., "Hybrid organic–inorganic semiconductor–based light–emitting diodes" J. Appl. Phys., 82(8), pp. 4126–4128,(Oct. 15, 1997).

Hines et al., "Synthesis and Characterization of Strongly Luminescing ZnS–Capped CdSe Nanocrystals,".J. Phys. Chem. 100, pp. 468–471 (1996).

Imhof et al., Nature 1997, 389, 948.

Jarvis, Jr. et al., Mat. Res. Soc. Symp. Proc. 272, pp. 227–234 (1992).

Kagan et al., "Electronic Energy Transfer in CdSe Quantum Dot Solids," Physical Review Letters, 76, pp. 1517–1520, (Feb. 26, 1996).

Kagan et al., "Long–range resonance transfer of electronic excitations in close–packed CdSe quantum–dot solids," Physical Review Letters, 54, pp. 8633–8643, (Sep. 15, 1996).

Klimov, et al., "Quantization of Multiparticle Auger Rates in Semiconductor Quantum Dots", Science, vol. 287, pp. 1011–1013, (Feb. 11, 2000).

Klimov, et al., "Ultrafast dynamics of inter– and intraband transitions in semiconductor nanocrystals: Implications for quantum–dot lasers", Physical Review B, vol. 60, No. 4, pp. 2177–2180, (Jul., 15, 1999).

Kortan et al., "Nucleation and Growth of CdSe on ZnS Quantum Crystallite Seeds, and Vice Versa, In Inverse Micelle Media" J. Am. Chem. Soc. 112:1327–1332, 1990.

Kuno, et al., "The band edge luminescence of surface modified CdSe nanocrystallites: Probing the luminescing state", J. Chem. Phys. 106(23), pp. 9869–9882, (Jun. 15, 1997).

Leatherdale, et al., "Photoconductivity in CdSe quantum dot solids", vol. 62, No. 4, pp. 2669–2680, (Jul. 15, 2000), Physical Review B.

Lawless, J. Phys. Chem. 1995, 99, 10329–10335.

Lee et al., "Surface Derivatization of Nanocrystalline CdSe Semiconductors," Mat. Res. Soc. Symp. Proc. 452, pp. 323–328, (1997).

Lee et al. "Full Color Emission from II–VI Semiconductor Quantum Dot–Polymer Composites," Adv. Mater. 12(15):1102–1105, 2000.

Lett, D. N., "Color–Coding Quantum Dots Debut With Promising Careers In Clinical Diagnostics Field", BioWorld Today, vol. 9, No. 185, p. 1, (1998).

Liz–Marzán, et al., "Synthesis of Nanosized Gold–Silica Core–Shell Particles," Langmuir 12, pp. 4329–4335, (1996).

Ludolph et al., "Novel single molecule precursor routes for the direct synthesis of highly monodispersed quantum dots of cadmium or zinc sulfide or selenide", Chem. Commun., pp. 1849–1850, (1998).

Malik, et al., South African Journal of Science, 96, pp. 55–60. (2000).

Mattoussi et al., J. Am. Chem. Soc. 2000, 122, 12142.

Michael, et al., "Randomly Ordered Addressable High–Density Optical Sensor Arrays", Analytical Chemistry, vol. 70, No. 7, pp. 1242–1248, (Apr. 7, 1998).

Mikulec et al., "Synthesis and Characterization of Highly Luminescent (CdSe)ZnS Quantum Dots," Materials Research Society Symposium, 452, pp. 359–364, (1997).

Müllenborn et al., "Characterization of Solution–Synthesized CdTe and HgTe," Applied Physics, 56, pp. 317–321, (1993).

Murray et al., "Synthesis and Characterization of Nearly Monodisperse CdE (E=S, Se, Te) Semiconductor Nanocrystallites", J. Am. Chem. Soc., vol. 115, No. 19, pp. 8706–8715, (1993).

Nirmal et al., "Fluorescence intermittency in single cadmium selenide nanocrystals", Nature, vol. 383, pp. 802–804, (Oct. 31, 1996).

Nozik et al., MRS Bulletin, 23(2), pp. 24–30 (1998).

Pehnt et al., "Nanoparticle Precursor Route to Low–Temperature Spray Deposition of CdTe Thin Films," Appl. Phys. Lett., 67(15), pp. 2176–2178, (Oct. 9, 1995).

Peng, et al., "Epitaxial Growth of Highly Luminescent CdSe/CdS Core/Shell Nanocrystals with Photostability and Electronic Accessibility," J. Am. Chem. Soc., 119, pp. 7019–7029, (1997).

Rogach et al., "Synthesis and characterization of Thiol–Stabilized CdTe Nanocrystals" Ber. Bunsenges. Phys. Chem., 100 (11), pp. 1772–2778, (1996).

Spanhel et al., "Photochemistry of Colloidal Semiconductors. Surface Modification and Stability of Strong Luminescing CdS Particles", J. Am. Chem. Soc., 109 (19), pp. 5649–5655, (1987).

Malyarevich, A. M. et al, "Nonlinear optical properties of $Cu_xS$ and $CuIS_2$ nanoparticles in sol–gel glasses," Journal of Applied Physics, vol. 87, No. 1, pp. 212–216, (2000). (month Unkown).

Righini, Giancarlo C. et al., "Sol–gel glasses for nonlinear optics," Pure Appl. Opt., vol. 5, pp. 655–666, (1996).

Ekimov, A. I. et al., "Quantum Confined Atoms of Doped ZnO Nanocrystals", Phys. Stat. Sol (b) 229, No. 2, 897–901 (2000). (no month).

Ekimov, A. I. et al., "Spin–flip and acoustic–phonon Raman scattering in CdS nanocrystals", Physical Review B, vol. 58, No. 4, 15 (Jul. 1998–II), 2077–2087.

Ekimov, A. I. et al., "CdS nanocrystal growth in thin silica films: evolution of size distribution function", Journal of Crystal Growth 184/185 (1998) 360–364. (no month).

Ekimov, A. I. et al, "Dynamics of excitons in CuBr nanocrystals: Spectral–hole burning and transient four–wave–mixing measurements," Physical Review B, vol. 57, No. 3, Jan. 15, 1998–I, 1774–1783.

Ekimov, A. I. et al., "Size–selective resonant Raman scattering in CdS doped glasses," Physical Review B, vol. 57, No. 1, Jan. 1, 1998–I, 341–346.

Ekimov, A. I. et al., "Growth and optical properties of semiconductor nanocrystals in a glass matrix," Journal of Luminescence 70 (1996) 1–20. (no month).

Ekimov, A. I. et al., "Size dependence of acoustic and optical vibrational modes of CdSe nanocrystals in glasses," Journal of Non–Crystalline Solids 197 (1996) 238–246. (no month).

Ekimov, A. I., "Subpicosecond dynamics of confined excitons in CuCi nanocrystals," Materials Science and Engineering A217/218 (1996) 167–170. (no month).

Ekimov, A. I. et al., "Enhancement of electron–hole exchange interaction in CdSe nanocrystal; A quantum confinement effect," Physical Review B, vol. 53, No. 3, Jan. 15, 1996–I, 1336–1342.

Ekimov, A. I. et al., "Subpicosecond dynamics of confined excitons and optical nonlinearities of CuCl quantum dots," Journal of Luminescence 66 & 67 (1996) 406–409. (no month).

Ekimov, A. I. et al., "Size–dependent Electron–Hole Exchange Interaction in CdSe Quantum Dots, Il Nuovo Cimento," vol. 17, Nos. 11–12, (1995) 1407–1412. (no month).

Ekimov, A. I. et al., "Polaron and Exciton–Phonon Complexes in CuCl Nanocrystals," Physical Review Letters, vol. 74, No. 9, Feb. 27, 1995, p. 1645.

Elimov, A. I. et al., "Growth of CdSe nanocrystals in ion–implanted $SiO_2$ films," Journal of Crystal Growth 151 (1995) 38–45. (no month).

Ekimov, A. I. et al., "Effects of Resonance on Low–Frequency Raman Scattering From Semiconductor Nanocrystals," Radiation Effects and Defects in Solids, 1995, vol. 137, pp. 45–50. (no month).

Ekimov, A. I. et al., "Optical Properties of Oxide Glasses Doped by Semiconductor Nanocrystals," Radiation Effects and Defects in Solids, 1995, vol. 134, pp. 11–22. (no month).

Ekimov, A. I. et al., "Enhancement of Exciton Exchange Interaction by Quantum Confinement in CdSe Nanocrystals," Jpn. J. Appl. Phys, vol. 34, 12–14 (1994). (no month).

Ekimov, A. I. et al., "Growth of CdS nanocrystals in silicate glasses and in thin $SIO_2$ films in the Initial states of the phase separation of a solid solution," Semiconductors, 28 (5), May 1994, 486–493.

Ekimov, A. I. et al., "Interface effects on the properties of confined excitined excitons in CuCl microcrystals," Journal of Luminescence 60 & 61 (1994) 396–399. (no month).

Ekimov, A. I. et al., "Surface Recombination of Nonequilibrium Electron–Hole Plasma in Laser–Modified Semiconductor–Doped Glasses," Solid State Communications, vol. 87, No. 6, 577–580 (1993). (no month).

Ekimov, A I. "Dynamics of Nonlinear Optical Response of CuBr–Doped Glasses," Superlattices and Microstructures, vol. 3, No. 2, 199–202 (1993). (no month).

Ekimov, A. I., "Absorportion and intensity–dependent photoluminescence measurements on CdSe quantum dots: assignment of the first electronic transitions," Journal of the Optical Society of American, vol. 10, Nos. 1–12, 100–107 (1992). (no month).

Ekimov, A. I. et al. "Preparation and investigation of $SIO_2$ films activated by CdS semiconductor nanocrystals," Soviet Physics Semiconductors, vol. 26, 57–59 (1992). (no month).

Ekimov, A. I. et al. "Generation of reflected second harmonic at semiconductor quantum dots," JETP Letters, vol. 55, No. 8, 435–439 (1992). (no month).

Elimov, A. I. et al. "Dimensional Effects in Luminescence Spectra of Zero–Dimensional Semiconductor Structures," Bulletin of the Russian Academy of Sciences, vol. 56, No. 2, pp. 154–157, Feb., 1992.

Ekimov, A. I. et al., "Fast switching of the transmission of light by glasses activated with CdS microcrystals," *Sov. Phys. Semicond.*, vo. 25 No. 2, 164–166 (1991). (no month).

Ekimov, A. I. et al., "Resonance Raman Spectroscopy of Electron–Hole Pairs—Polar Phonon Coupling in Semiconductor Quantum Microcrystals," *Solid State communications*, vol. 78, No. 10, pp. 853–856, 1991. (no month).

Ekimov, A. I. et al., "Optics of Zero Dimensional Semiconductor Systems, *Acta Physica Polonica A*," vo. 79 (1991), No. 1. pp. 5–14. (no month).

Ekimov, A. I. et al., "Optical Properties of Semiconductor Quantum Dots in Glass Matrix," *Physica Scripta*. vol. T39, 217–222 (1991). (no month).

Ekimov, A. I. et al. "Rapid Processes of Darkening and Bleaching in CdS Doped Glasses," *Superlattices and Microstructures* vol. 10, No. 3, 307–310 1991 (no month).

Ekimov, A. I. et al., "Auger ionization of semiconductor quantum drops in a glass matrix," *Journal of Luminescence* 47 (1990) 113–127 North–Holland. (no month).

Ekimov, A. I. et al., "Time–Resolved Luminescence of CdSe Microcrystals," *Solid State Communications*, vol. 74, No. 7, pp. 555–557, 1990. (no month).

Ekimov, A. I. et al., "Quanturm–Size Stark Effect in Semiconductor Microcrystals," *Journal of Luminescence* 46 (1990) 97–100 North–Holland. (no month).

Ekimov, A. I. et al., "Spectra and Decay Kinetics of Radiative Recombination in CdS Microcrystals," *Journal of Luminescence* 46 (1990) 83–95 North–Holland. (no month).

Ekimov, A. I. et al., "Influence of high hydrostatic pressures on the excition spectrum of CdS microcrystals in glass," *Sov. Phys. Semicond*. 23(9), Sep. 1989, pp. 965–66.

Ekimov, A. I. et al., "Photoluminescence of quasizero–dimensional semiconductor structures," *Solid State* 31(8), Aug. 1989, pp. 1385–93.

Ekimov, A. I. et al., "Photoionization of semiconducting microcrystals in glass," *Sov, Phys. Solid State* 31(1), Jan. 1989, pp. 149–151.

Ekimov, A. I. et al., "Donor–like Exciton in Zero–Dimension Semiconductor Structures," *Solid State Communications*, vol. 69, No. 5, pp. 565–568, 1989, (no month).

Ekimov, A. I. et al., "Nonlinear Optics of Semiconductor–Doped Glasses," *Phys. Stat. Sol.* (b) 150, (1988) pp. 627–633. (no month).

Ekimov, A. I. et al., "Nonlinear optical properties of semiconductor microcrystals," JETP Lett., vol. 46, No. 10, Nov. 25, 1987 pp. 495–499.

Ekimov, A. I. et al., "Quantization of the energy spectrum of holes in the adiabatic potential of the electron," JETP Lett., vol. 43, No. 6, Mar. 25, 1986, pp. 376–379.

Ekimov, A. I. et al., "Quantum Size Effect in Semiconductor Microcrystals," *Solid State Communications*, vol. 56, No. 11, pp. 921–924, 1985. (no month).

Ekimov, A. I. et al., "Size quantization of the electron energy spectrum in a microscopic semiconductor crystal," JETP Lett., vol. 40, No. 8, Oct. 25, 1984, p. 1136–1139.

Ekimov, A. I. et al., "Quantum size effect in the optical spectra of semiconductor microcrystals," Sov. Phys. Semicond. 16(7), Jul. 1982, pp. 775–778.

Ekimov, A. I. et al., "Quantum size effect in three–dimensional microscopic semiconductor crystals," JETP Lett, vol. 34, No. 6, Sep. 20, 1981, pp. 345–349.

Ekimov, A. I. et al., "Oscillations of polarization of recombination radiation of a variable gap semiconductor in a magnetic field," JETP Lett., vol. 25 No. 55, 526–528 (1997). (no month).

T. Takada et al. Control of particle size distribution of CdS quantum dots in gel matrix. Journal of Sol–Gel Science and Technology 1:123–132, 1994.*

* cited by examiner

SEMICONDUCTOR NANOCRYSTAL COMPOSITE

CLAIM OF PRIORITY

This application claims priority to U.S. patent application Ser. No. 60/322,466, filed on Sep. 17, 2001, the entire contents of which are hereby incorporated by reference.

FEDERALLY SPONSORED RESEARCH OR DEVELOPMENT

The U.S. Government may have certain rights in this invention pursuant to Grant No. DMR-9808941 awarded by the National Science Foundation and Contract No. N00014-01-0787 awarded by the Office of Naval Research.

TECHNICAL FIELD

The present invention relates to composites including semiconductor nanocrystals.

BACKGROUND

In general, a composite is a material that contains two or more components. Each component can contribute unique properties to the composite. As a result, the composite can have the advantageous properties of each component, all of which would not be present in a material that is lacking one of the components. Some composite materials can be particularly well-suited for use, for example, in optical, electronic, optoelectronic, magnetic, or catalytic applications.

In optical applications, the composite material can form a waveguide or an optical amplifier. Optical amplifiers utilize a gain medium to amplify optical radiation. In an amplifier, a source excites the gain medium to produce a population inversion between high and low energy states of the gain medium. The excited gain medium can amplify optical radiation at energies overlapping the energy differences between the high and low energy states of the population inversion because stimulated emission of radiation from the medium is more efficient than absorption of light. In general, a laser utilizes a cavity to supply feedback to an excited gain medium to cause amplified spontaneous emission. A laser cavity can include a series of optical components, such as mirrors, arranged relative to the gain medium to reflect radiation back into the cavity and thereby provide feedback. For example, a gain medium can be placed into a stable or unstable resonator. Alternatively, amplified spontaneous emission can occur in an excited gain medium without external optical components if the gain medium has a length, $L$, and gain coefficient, $G$ (cm$^{-1}$) sufficient to satisfy the expression:

$$G \cdot L \gg 1$$

where the gain coefficient, $G$, is related to the stimulated emission cross section and the difference in the population densities of the high and low energy states generated by the population inversion.

Conventional solid-state and gas lasers and amplifiers generally provide very specific spectral outputs depending upon the laser material. If a spectral output other than that achievable with available gain materials or a less specific spectral output is desired, dye lasers or tunable optical parametric oscillators (OPA) or amplifiers (OPA) can be used. Dye lasers are large and bulky and also require fluid components that can be toxic.

SUMMARY

In general, a composite includes a plurality of nanocrystals incorporated in an inorganic matrix. The inorganic matrix can be a metal oxide matrix prepared, for example, by sol-gel processing, or other low temperature matrix-forming methods. The metal oxide matrix can be crystalline or non-crystalline. The metal oxide matrix can be free of light-scattering defects, such as, for example, cracks.

The synthesis incorporating nanocrystals and the preparation of the matrix can be decoupled. Narrow size distribution, high quality nanocrystals with high fluorescence efficiency can be first prepared using previously established literature procedures and used as the building blocks. See, C. B. Murray et al., *J. Amer. Chem. Soc.* 1993, 115, 8706, B. O. Dabbousi et al., *J. Phys. Chem. B* 1997, 101, 9463, each of which is incorporated by reference in its entirety. The organic, surface-passivating ligands on a surface of the nanocrystal can be exchanged to stabilize the nanocrystals in polar solvents like ethanol, and also to provide a tether with which the nanocrystals are incorporated into the titania sol-gel matrix. Formation of a titania matrix using a titanium (IV) alkoxide precursor exposed controllably to moisture (see, A. Imhof et al., *Nature* 1997, 389, 948, incorporated by reference in its entirety) obviates the use of acid catalysts that can be detrimental to the optical properties of the nanocrystals. Thermal annealing can complete the composite preparation. In this process, the gelation time under an inert atmosphere can be important, as incomplete incorporation of the nanocrystals into the matrix can lead to microscale phase separation of the nanocrystals from the titania matrix and the formation of optically scattering films.

The composite includes a coordinating ligand including a moiety that is compatible with, soluble within, or reacts with the matrix. The coordinating ligand can have the formula

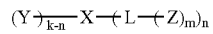

in which k is 2, 3 or 5, n is 1, 2, 3, 4 or 5, and m is 1 or 2, 3, 4, 5, 6, 7, 8, 9, or 10, X is O, S, S=O, SO$_2$, Se, Se=O, N, N=O, P, P=O, As, or As=O, each of Y and L, independently, is a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3–5 membered heterocycloalkyl, monocyclic aryl, 5–6 membered heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by —O—, —S—, —N(R$^e$)—, —N(R$^e$)—C(O)—O—, —O—C(O)—N(R$^e$)—, —N(R$^e$)—C(O)—N(R$^f$)—, —O—C(O)—O—, —P(R$^e$)—, or —P(O)(R$^e$)—, each of R$^e$ and R$^f$, independently, is hydrogen, alkyl, alkenyl, alkynyl, alkoxy, hydroxylalkyl, hydroxyl, or haloalkyl, and Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester. In certain circumstances, k is 3, n is 1, 2, or 3, and m is 1, 2, or 3, X is P or P=O, Y is C$_{1-6}$ alkyl, L is a straight or branched C$_{2-6}$ hydrocarbon chain, and Z is hydroxy, carboxyl, carboxylate, amine, or amide.

In another aspect, a method of manufacturing a composite includes providing a semiconductor nanocrystal, providing a matrix precursor, contacting the semiconductor nanocrystal with a coordinating ligand that includes a moiety that is compatible with, soluble within, or reacts with a matrix, contacting the semiconductor nanocrystal with a precursor of the matrix, and forming a solid from the precursor and the semiconductor nanocrystal. The precursor can be a metal halide or a metal alkoxide. The solid can be formed by coating the precursor and semiconductor nanocrystal on a substrate.

In one aspect, a gain medium includes a plurality of semiconductor nanocrystals distributed in a metal oxide matrix. The gain medium can be used to amplify optical radiation or produce optical radiation by lasing. In particular, the gain medium includes concentrated solids of semiconductor nanocrystals, such as close-packed films of semiconductor nanocrystals, that provide high gain to produce optical amplification or lasing over short amplifier or cavity lengths.

A laser includes an optical gain medium and a cavity arranged relative to the optical gain medium to provide feedback. The optical gain medium can include a plurality of semiconductor nanocrystals distributed in a metal oxide matrix.

A waveguide can include a layer of a composite, the composite including a plurality of semiconductor nanocrystals distributed in a metal oxide matrix. The waveguide can include a plurality of layers, at least one of which contains a semiconductor nanocrystal. The waveguide can include a first layer including a first composite and a second layer including a second composite, each of the first composite and the second composite including a plurality of semiconductor nanocrystals, the first composite having an index of refraction different from the index of refraction of the second composite.

A method of amplifying an optical signal includes directing an optical beam into a composite including a plurality of semiconductor nanocrystals distribute in a metal oxide matrix.

A method of forming a laser includes arranging a cavity relative to an optical gain medium to provide feedback to the optical gain medium. The optical gain medium includes a plurality of semiconductor nanocrystals distributed in a metal oxide matrix.

The composite can be substantially free of defects, reducing loses, such as scatter, such that the composite does not provide gain to optical radiation. The composite can provide gain to an optical signal at an energy equal to or less than the maximum band gap emission of the nanocrystals. The composite also can be capable of providing gain at energies in which a concentrated solid is substantially free of absorption.

The composite can include greater than 0.2%, greater than 5%, greater than 10%, or greater than 15% by volume semiconductor nanocrystals. The each of the plurality of semiconductor nanocrystals includes a same or different first semiconductor material. The first semiconductor material can be a Group II-VI compound, a Group II-V compound, a Group III-VI compound, a Group III-V compound, a Group IV-VI compound, a Group I-III-VI compound, a Group II-IV-VI compound, or a Group II-IV-V compound, such as, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. Each first semiconductor material is overcoated with a second semiconductor material, such as ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. Each first semiconductor material has a first band gap and each second semiconductor material has a second band gap that is larger than the first band gap. Each nanocrystal can have a diameter of less than about 10 nanometers. The plurality of nanocrystals has a monodisperse distribution of sizes. The plurality of nanocrystals has a plurality of monodisperse distribution of sizes. The plurality of monodisperse distribution of sizes can provide gain over a broad range of energies or over a plurality of narrow ranges, e.g., a full width at half max (FWHM) of gain less than 75 nm, in which the gain maxima occur at a separate energy such that at least some of the narrow ranges do not overlap in energy. The concentrated solid of nanocrystals is disposed on a substrate such as glass. The concentrated solid of nanocrystals has a thickness greater than about 0.2 microns.

The metal oxide matrix can include a titanium oxide, an aluminum oxide, a silicon oxide, a magnesium oxide, a boron oxide, a phosphorus oxide, a germanium oxide, an indium oxide, a tin oxide, a zirconium oxide, or mixtures thereof.

Stabilization of nanocrystals within a titania matrix in the composite at volume fractions high enough to observe amplified spontaneous emission (ASE) can lead to advantages, such as the observation of ASE at room temperature to the creation of more complicated structures showing ASE at multiple wavelengths. Coupling such structures to suitable feedback will allow for the development of room temperature lasers that are tunable over a wide spectral window. These matrices may also be useful for other non-linear optical applications of nanocrystals, where high nanocrystal density and matrix stability are important.

Other features, objects, and advantages of the invention will be apparent from the description and drawings, and from the claims.

DETAILED DESCRIPTION

Figure 1:
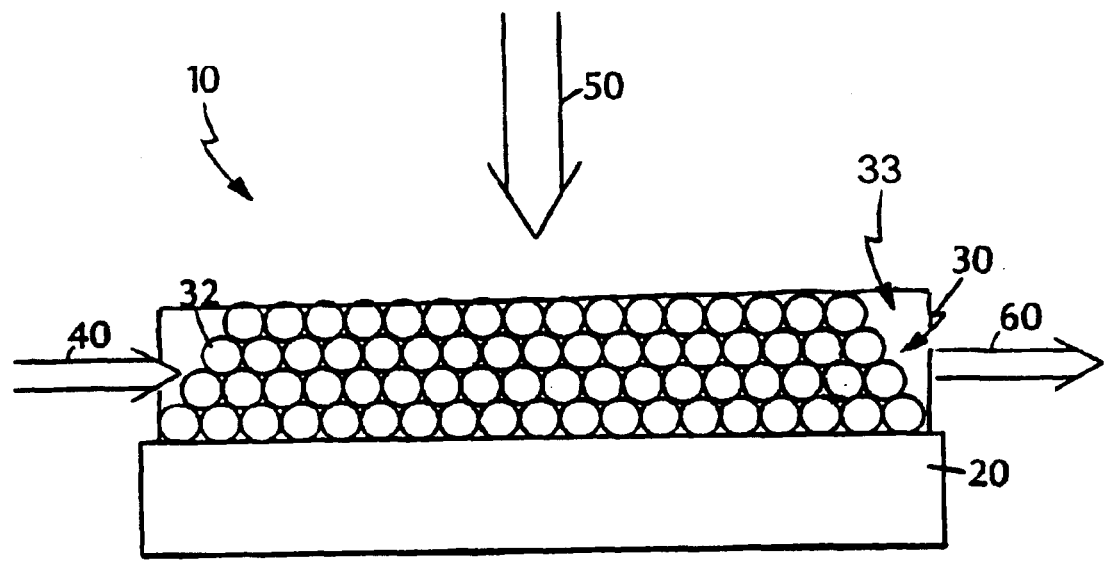
FIG. 1 is a schematic diagram of a composite.

Chemically synthesized semiconductor nanocrystals (NCs) offer the promise of a color-tunable, flexible, all-purpose chromophore system, in which strong quantum confinement of the carriers leads to unique size-dependent optical properties. See, A. P. Alivisatos, *Science* 1996, 271, 933, M. Bruchez et al., *Science* 1998, 281, 2013, W. C. Chan et al., *Science* 1998, 281, 2016, H. Mattoussi et al., *J. Am. Chem. Soc.* 2000, 122, 12142, each of which is incorporated by reference in its entirety. Strong quantum confinement in principle makes these nanocrystals potential building blocks in non-linear optical applications. For example, the reduced dimensionality and the resulting quantum confinement of carriers in nanocrystals should facilitate in the development of temperature insensitive and easily tunable gain media. See, M. Asada et al., *IEEE J. Quant. Electron.* 1986, 22, 1912 and Y. Arakawa et al., *Appl. Phys. Lett.* 1982, 40, 939, each of which is incorporated by reference in its entirety. Recently Klimov et al., *Science* 2000, 290, 314, reported the first observation of amplified spontaneous emission (ASE) in closed-packed films of CdSe nanocrystals, and deduced the necessary parameters to facilitate stimulated emission. A high nanocrystal concentration with a narrow size distribution is critical to overcome the inherent Auger ionization process that prevented previous observation of ASE in nanocrystal films. See, J. Butty et al., *Appl. Phys. Lett.* 1995, 67, 2672, H. Giessen et al., *Phase Transitions* 1999, 68, 59, F. Gindele et al., *Appl. Phys. Lett.* 1997, 71, 2181, each of which is incorporated by reference in its entirety.

Nanocrystals can be stabilized within an inorganic sol-gel, metal oxide (e.g., titania) matrix at sufficiently high volume fractions to observe ASE. The unique optical properties of the nanocrystals can be exploited to produce composites with narrow gain profiles that are tunable through most of the visible spectrum (550 nm to 650 nm). The superior stability of this matrix-nanocrystal composite, as compared to the close-packed films, can be utilized to yield nanocrystal-titania waveguides that show ASE behavior not only at 80 K but also consistently at room temperature. Finally, the added ability of the nanocrystals to tune the refractive index of the composite nanocrystal-titania films, when combined with the facile synthetic conditions required to produce these composites, can allow us to create more complicated wave-guide structures that show ASE simultaneously at spectrally distinct regions while being excited with a single source; a first step towards the production of a nanocrystal-based white laser.

Amplifiers and lasers include gain media for amplifying radiation or producing radiation by lasing. The gain medium can include a plurality of semiconductor nanocrystals. The nanocrystals can be illuminated with a light source at an absorption wavelength to cause an emission at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. No. 6,322,901, incorporated herein by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis (silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating ligand in the solvent of the reaction mixture can help control the growth of the nanocrystal. The coordinating ligand is a compound having a donor lone pair that, for example, has a lone electron pair available to coordinate to a surface of the growing nanocrystal. Ligand coordination can stabilize the growing nanocrystal. Typical coordinating ligands include phosphines, phosphine oxides, phosphonic acids, or phosphinic acids. Other coordinating ligands, such as pyridines, furans, and amines may also be suitable for the nanocrystal production. Examples of suitable coordinating ligands include pyridine, tri-n-octyl phosphine (TOP) and tri-n-octyl phosphine oxide (TOPO). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901, incorporated herein by reference in its entirety. By adjusting the temperature of the reaction mixture during overcoating and monitoring the absorption spectrum of the core, over coated materials having high emission quantum efficiencies and narrow size distributions can be obtained.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating ligand used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

The coordinating ligand can include a moiety that is compatible with, soluble within, or reacts with the matrix. More particularly the ligand can have the formula

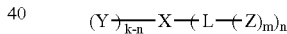

where k is 2, 3 or 5, n is 1, 2, 3, 4 or 5, and m is 1, 2, 3, 4, 5, 6, 7, 8, 9, or 10. X is O, S, S=O, SO$_2$, Se, Se=O, N, N=O, P, P=O, As, or As=O. Each of Y and L, independently, is a straight or branched C$_{2-12}$ hydrocarbon chain optionally containing at least one double bond, at least one triple bond, or at least one double bond and one triple bond. The hydrocarbon chain can be optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3–5 membered heterocycloalkyl, monocyclic aryl, 5–6 membered heteroaryl, C$_{1-4}$ alkylcarbonyloxy, C$_{1-4}$ alkyloxycarbonyl, C$_{1-4}$ alkylcarbonyl, or formyl. The hydrocarbon chain can be optionally interrupted by —O—, —S—, —N(R$^e$)—, —N(R$^e$)—C(O)—O—, —O—C(O)—N(R$^e$)—, —N(R$^e$)—C(O)—N(R$^f$)—, —O—C(O)—O—, —P(R$^e$)—, or —P(O)(R$^e$)—. Each of R$^e$ and R$^f$, independently, can be hydrogen, alkyl, alkenyl, alkynyl, alkoxy, hydroxylalkyl, hydroxyl, or haloalkyl.

Z is a moiety that is compatible with, soluble within, or reacts with the matrix. For example, Z can be hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

Suitable coordinating ligand can be purchased commercially or prepared by ordinary synthetic organic techniques, for example, as described in J. March, *Advanced Organic Chemistry*, which is incorporated by reference in its entirety.

Composites including nanocrystals can be formed by redispersing a powder of semiconductor nanocrystals described above in a solvent containing a coordinating ligand that includes a moiety that is compatible with, soluble within, or reacts with the matrix. A matrix precursor can be a metal oxide precursor, such as a metal halide or alkoxide, for example, titanium alkoxide, an aluminum alkoxide, a silicon alkoxide, a magnesium alkoxide, a boron alkoxide, a phosphorus alkoxide, a germanium alkoxide, an indium alkoxide, a tin alkoxide, a zirconium alkoxide, or mixtures thereof. The metal oxide precursor can be obtained commercially or prepared by contacting a metal with an alcohol. A clear, fluorescent solution of nanocrystal in a metal oxide precursor (i.e., prepolymer) results, which is then filtered and spin-coated or drop cast onto a substrate, for example, under controlled humidity conditions, to generate a solid, such as a film. The film can be heated to form the matrix and cooled to form the composite. The relative ratio of nanocrystals, coordinating ligand, and components of the metal oxide precursor can be adjusted empirically to adjust the refractive index of the composite. The solids content of the solution can be adjusted to give the desired film thickness. The film thickness can also be controlled by the speed at which the films are spin coated. More complicated film geometries are synthesized by sequentially spin coating the different nanocrystal-titania prepolymer solutions and the buffer, neat titania layers and annealing the films between each successive spin-coating step.

The substrate can be made from any material that does not react with the nanocrystals. The substrate can be selected such that it is opaque or transparent at specific energies of optical radiation. The substrate can be formed in a variety of shapes. Examples of substrate materials include sapphire and silicon. Prior to receiving the film, a substrate can be cleaned by oxygen plasma to remove surface organic contaminants. Alternatively, silicon substrates can be prepared for drop casting by boiling them in ultra-pure water and drying them at about 175° C. to increase the hydrophilicity of the substrate's surface.

Transmission electron microscopy (TEM) can provide information about the size, shape, and distribution of the nanocrystal population. Powder x-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum. Solid nanocrystal thicknesses can be determined using an ultraviolet/visible spectrometer by measuring the optical absorption of the nanocrystal solid and applying Beer's law.

The composite can be substantially free of defects such that the films provide gain to optical radiation when excited by a source. Nanocrystal solids containing defects, i.e., those films not substantially free of defects, generate losses, e.g., scatter, such that the films do not generate gain in optical radiation when excited with a source. The thickness of the film can be, generally, between about 0.2 microns to 10 microns.

Pump-probe laser experiments, such as transient absorption femtosecond laser experiments, can be used to determine the optical gain of concentrated solids of semiconductor nanocrystals. Concentrated solids of semiconducting nanocrystals, such as close-packed solids, can exhibit gain of optical radiation of about $10\ cm^{-1}$, $25\ cm^{-1}$, $50\ cm^{-1}$, $100\ cm^{-1}$, or $1,000\ cm^{-1}$. The onset of gain in films of semiconductor nanocrystals occurs when a source excites the nanocrystals to produce electron-hole (e-h) pairs in the semiconductor nanocrystal. Gain can be observed in concentrated solids of semiconductor nanocrystals at a range of temperatures (between about 6K to 310K, or above) when the excitation source produces more than about 1.0, 1.5, or 2.0 e-h pairs per semiconductor nanocrystal. Increasing the source power density to increase the number e-h pairs can increase the gain of the film. Although described as optical, the excitation source can electrical. In general, the excitation source should be capable of generating a population inversion of the nanocrystal solid.

Gain in the concentrated solids occurs at energies equal to or lower than the band gap photoluminescence, i.e., emission. For example, the maximum gain can occur at an energy at or below the maximum band gap emission. The energy of the band gap emission, as described above, depends on the semiconductor material and the size of the quantum-confined nanocrystal. The energy difference between the maximum of the gain and the emission maximum decreases with decreasing size of the nanocrystal.

The composite of semiconductor nanocrystals can include nanocrystals of the same size and the same semiconductor materials to produce gain in a narrow band of radiation energies, such as in a band of energies having a FWHM less than about 75 nm. Alternatively, the semiconductor films can be made of different materials, the same material but with different sizes, or both, to produce gain in a broad band of radiation energies or in multiple narrow bands centered at different radiation energies.

Referring to FIG. 1, an amplifier 10 includes a substrate 20 and a gain medium 30. Gain medium 30 includes a composite of nanocrystals 32 in a metal oxide matrix 33. In operation, a user of amplifier 10 directs an input optical radiation beam 40 through gain medium 30 and provides an external optical radiation beam 50 to excite the gain medium to create a population inversion. Provided that the energy of input optical beam 40 overlaps the energies at which gain medium 30 facilitates gain, amplifier 10 amplifies optical beam 40 to produce an amplified output beam 60.

The general methodology for preparing nanocrystal-titania composites is as follows: The as-synthesized nanocrystals (see, C. B. Murray et al., *J. Amer. Chem. Soc.* 1993, 115, 8706, B. O. Dabbousi et al., *J. Phys. Chem. B* 1997, 101, 9463) are stripped of their native TOPO cap by two or three precipitation/redispersion cycles from a butanol-hexane solution with methanol. The resulting powder is evacuated under vacuum and brought into a nitrogen-atmosphere glove box. The nanocrystals are then redispersed in a minimum volume of tetrahydrofuran and then mixed with ethanol and stoichiometric equivalents of tris-hydroxylpropylphosphine (tHPP) and titanium (IV) butoxide (TBOT). This solution was allowed to stir within the glove box at 60° C. for at least 3–4 hours. A clear, fluorescent solution of nanocrystal in a titania prepolymer results, which is then filtered and spin-coated onto a pre-cleaned glass microscope slide in a humidity controlled (~20%) box. The resulting film is then transferred to a heating block at 200° C. for 2 minutes. Finally, the glass slide is allowed to cool down rapidly to room temperature to yield a clear nanocrystal/titania composite film. The relative ratio of nanocrystals and tHPP/TBOT was empirically determined by the required refractive index of the composite film. The ratio of tHPP/TBOT and ethanol was determined by the desired film thickness. The film thickness can also be controlled by the speed at which the films are spin coated. More complicated film geometries are synthesized by sequentially spin coating the different nanocrystal-titania prepolymer solutions and the buffer, neat titania layers and annealing the films between each successive spin-coating step.

The absorption and refractive index characteristics of the films were characterized using a Cary spectrometer and a Gaetner ellipsometer, respectively. Interference fringes of the films, when coupled with film thickness, measured independently using a profilometer, provide an estimate of the refractive index of the films. Volume fractions of nanocrystals within these composites were computed from absorption and profilometer measurements using previously calculated absorption cross-section values for the nanocrystals (see, L. A. Coldren, U.S. Pat. No. 4,896,325). The films were characterized using AFM for surface roughness and distributions of surface cracks.

Optical investigations of the films were as follows: The films were studied either directly in air, or mounted into a cryostat. The cryostat was then either cooled down to 80 K or kept at room temperature. The films were optically pumped perpendicular to the wave-guiding direction using a 100 fs, regeneratively-amplified Ti-sapphire laser (400 nm), which is focused down into a stripe using a cylindrical lens. The wave-guided fluorescence is then collected using a fiber optic cable normal to the direction of excitation, dispersed in a spectrometer, and collected using a liquid-nitrogen cooled CCD camera.

Figure 2:
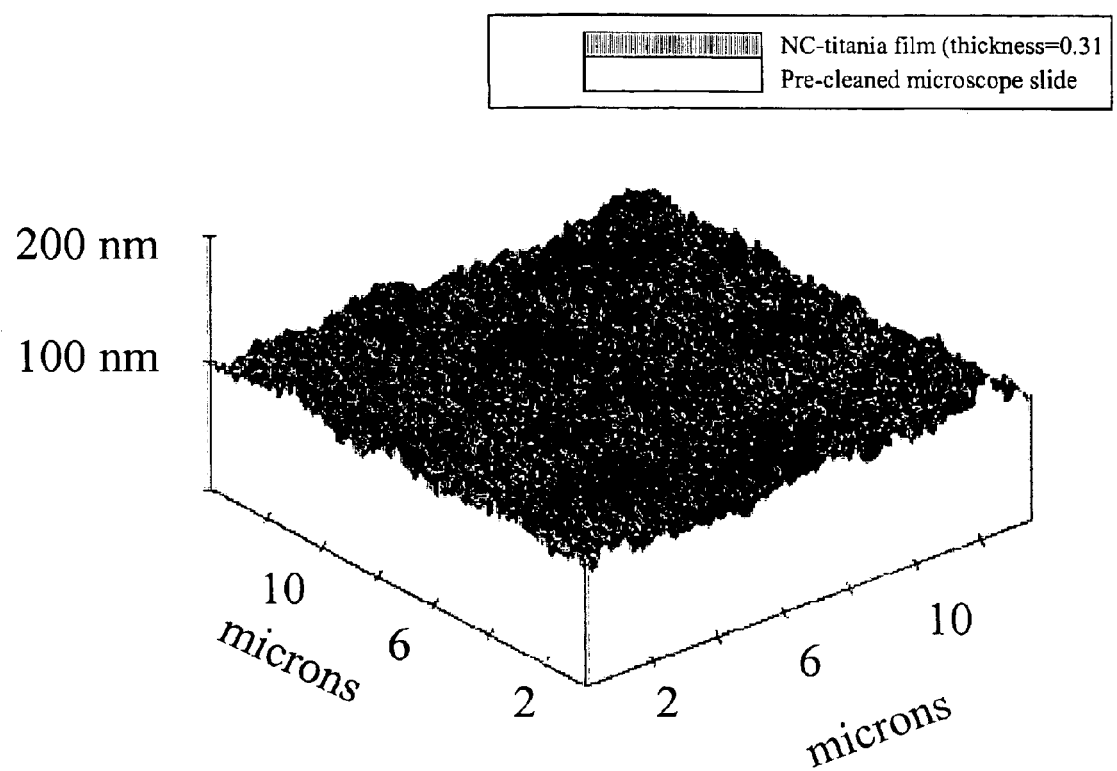
FIG. 2 is an atomic force microscopy (AFM) image of nanocrystal-titania film over a 13 μm×13 μm area showing the absence of macroscopic defects and with a calculated surface roughness (RMS) of approximately 6 nm. The inset shows a cartoon representation of the spin-coated film (thickness=0.31 μm) on a pre-cleaned glass microscope slide.

FIG. 2 shows an AFM scan of an optically clear nanocrystal-titania composite after thermal annealing. The surface roughness (RMS) over a 13 μm×13 μm area is approximately 6 nm. Such roughness is on the order of the size of the nanocrystal stabilized (5 nm diameter) within the composite. We do not see macroscopic cracks or other defects over the scanned area, which would reduce the wave-guiding efficiency of the composite film and hinder the observation of ASE. Absorption spectra of composite films are combined with film thickness measurements and absorption cross-sections for the nanocrystals (see, C. A. Leatherdale, Ph.D. Dissertation, Massachusetts Institute of Technology, 1999, incorporated by reference in its entirety) to calculate the volume fraction of nanocrystals in the films. Volume fractions of nanocrystals in these films can be tuned as high as 10–12%. Such volume fractions are higher than the theoretically required volume fractions (~1%) required for ASE as calculated by Klimov (see, V. I. Klimov et al., Science 2000, 290, 314, incorporated by reference in its entirety), but lower than the volume fractions achieved in close-packed nanocrystal films (~20%). We are able to reproducibly synthesize films over 1.5 $cm^2$ substrates with a thickness that can be tuned from 0.2 to 0.7 μm. The variation in film thickness over these macroscopic distances is typically between 10–20 nm. Additionally, we are also able to tune the refractive index of nanocrystal-titania films from 1.65 to 1.82 by tuning the volume fraction of nanocrystals in the matrices.

Figure 3A:
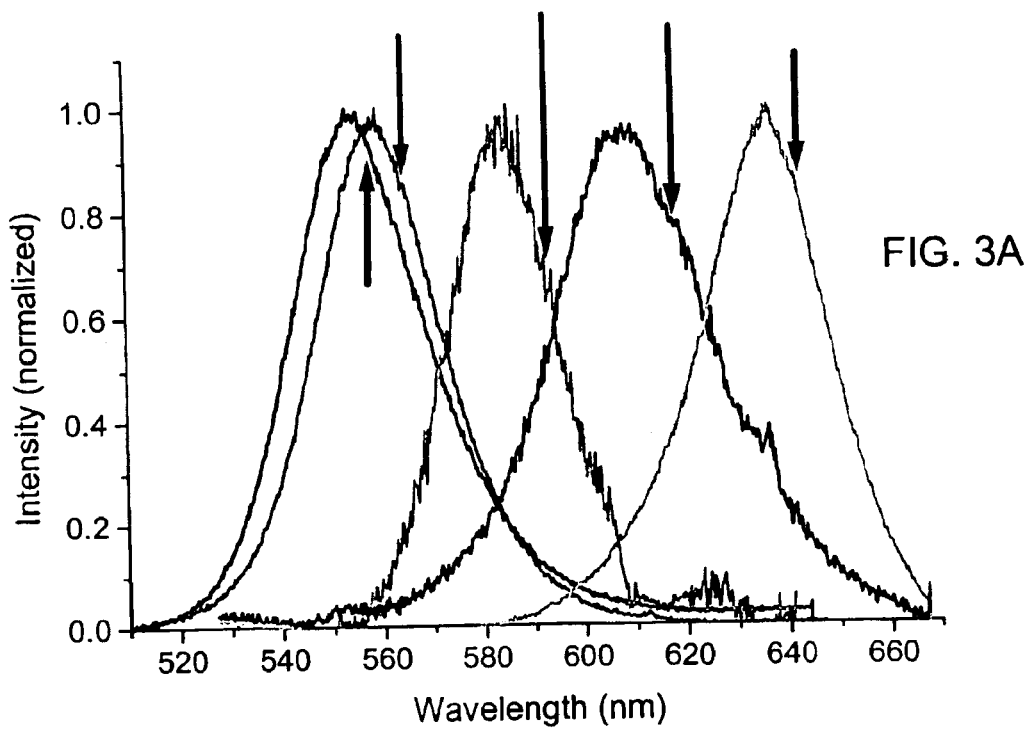
FIG. 3A is a plot of normalized emission spectra of nanocrystal-titania films below threshold at 80 K. Lack of sub-bandgap, deep-trap emission indicates the retention of the high quality of the as-synthesized nanocrystal upon incorporation into the titania films. The FWHM linewidth of the emission spectra range between 25 and 30 nm.
Figure 3B:
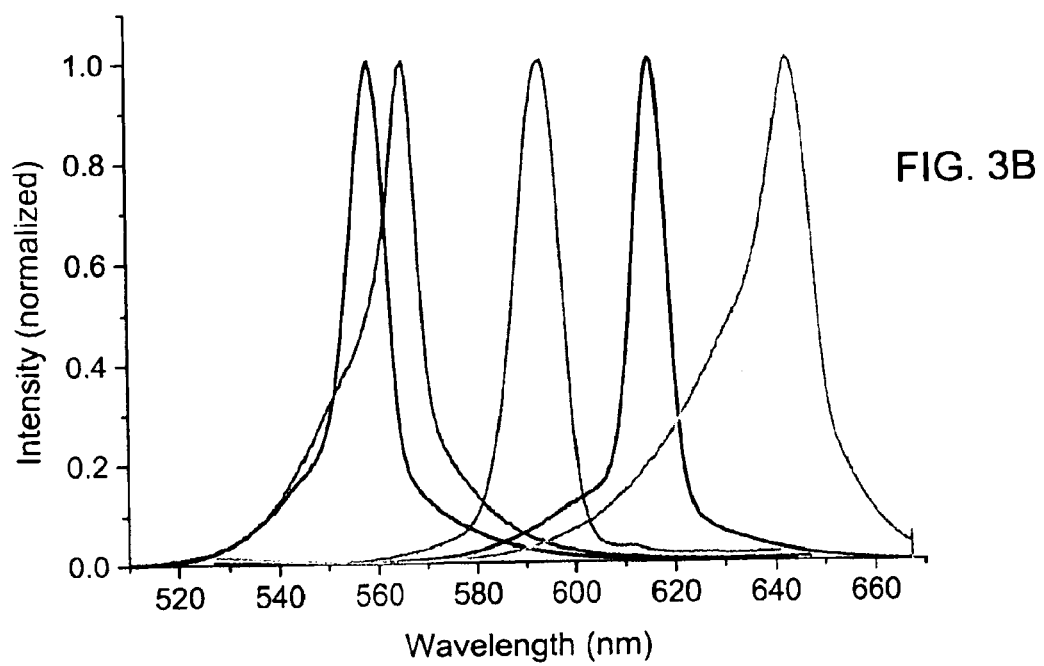
FIG. 3B is a plot of normalized emission spectra of the same films above threshold at 80K. Stimulated-emission mediated reduction in the linewidth (FWHM<11 nm) is evident on the long wavelength edge of the spontaneous emission spectra.

FIG. 3 demonstrates the appeal of using nanocrystals as the active gain material by showing the wide spectral window within which the nanocrystal gain profile can be tuned by using these nanocrystal-titania composites. Using the same stabilization chemistry, we exploit the size-dependent optical properties in these strongly quantum confined nanocrystals to synthesize nanocrystal-titania composites showing ASE from 560 nm to 650 nm. FIGS. 3A and 3B illustrate this flexibility by summarizing the optical response of a range of composite films at 80 K below and above the ASE threshold respectively. FIG. 3A shows the normalized emission spectra of different sized nanocrystals below the lasing threshold. The linewidth of the spontaneous emission peak in all these films is approximately 30 nm (FWHM), a linewidth that is indicative of the relatively narrow size-distribution of the as-synthesized nanocrystal. Absence of sub-bandgap, red trap luminescence also indicates the retention of the optical properties of the constituent nanocrystals throughout the sol-gel processing. Labeled with arrows on the spontaneous emission spectra are the positions of the observed ASE peaks. FIG. 3B shows the ASE spectra from the same composite films above threshold. A dramatic reduction in linewidths is quite apparent, as the FWHM of these ASE peaks is below 10 nm. Also, as is evident from FIGS. 3A and 3B, without exception the ASE peaks seen in these films are to the red edge of the spontaneous emission peak. Such behavior is consistent with the expectation that the net gain should be highest only to the red of the fluorescence peak, where reabsorption losses are minimized. Such behavior is also consistent with experimental observations of gain from Klimov et al. on close-packed nanocrystal films (see, V. I. Klimov et al., Science 2000, 290, 314 incorporated by reference in its entirety), but stands in contrast with observations from others. See, F. Gindele, Appl. Phys. Lett. 1997, 71, 2181, incorporated by reference in its entirety. The lack of a clear ASE signal (see, F. Gindele, Appl. Phys. Lett. 1997, 71, 2181, incorporated by reference in its entirety), however, prevents reconciliation of these differing results.

Figure 4:
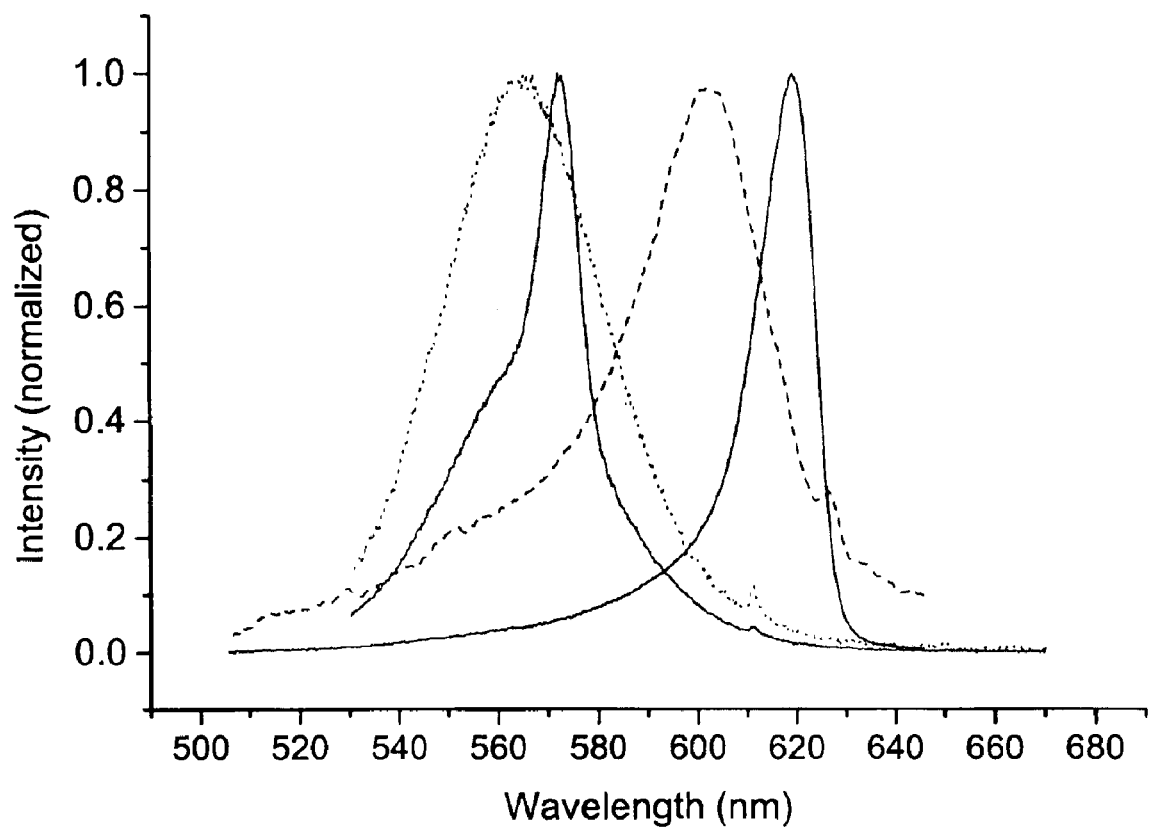
FIG. 4 is a plot of normalized emission spectra at room temperature of nanocrystal-titania film above (solid line) and below (dotted line) threshold. Again a reduction in the linewidth is observed as a result of the onset of stimulated emission in these composites. The ASE peak is located on the red-edge of the spontaneous emission peak.

The stability of nanocrystal-titania wave-guides, as compared to self-assembled films, is next exploited to demonstrate ASE at room temperature (RT). While the presence of a temperature insensitive gain profile in such strongly confined nanocrystal has been theoretically predicted and observed, observation of RT ASE has been hindered by the instability of the close-packed films even at 80 K. In the case of nanocrystal-titania films, however, rapid thermal annealing is expected to reduce the porosity by crosslinking and stabilizing the titania matrix. See, L. A. Coldren, U.S. Pat. No. 4,896,325, 1988, which is incorporated by reference in its entirety. Such stability is exploited to yield films showing ASE at room temperature in air. FIG. 4 shows the normalized emission spectra for the nanocrystal-titania waveguides above and below threshold. A reduction in the emission linewidth is again evident and the ASE peak is located on the red-edge of the spontaneous emission peak. Such observations portend well for the development of lasers assembled from nanocrystal-titania composites that, with suitable feedback mechanisms, will operate at room temperature.

Figure 5:
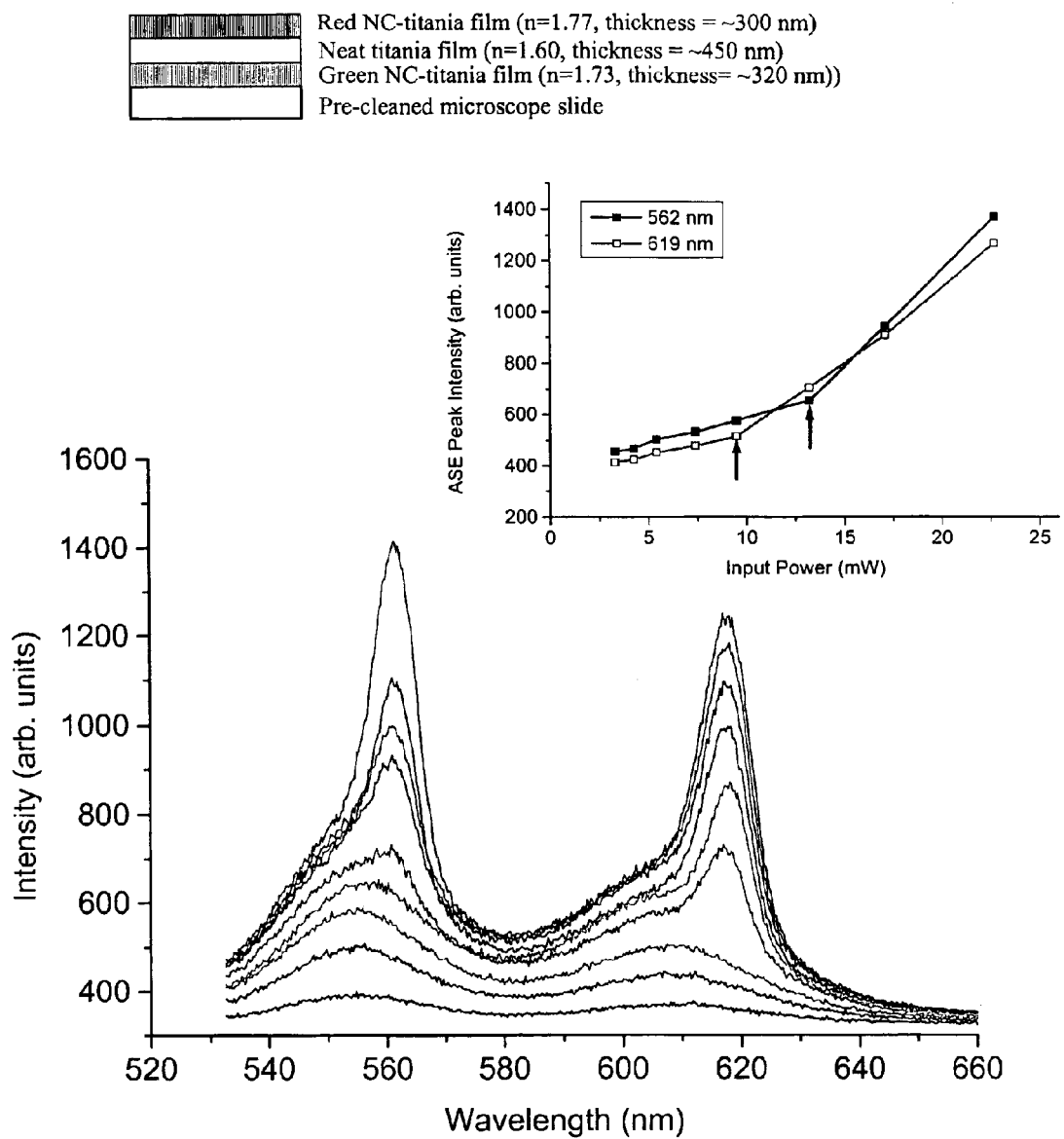
FIG. 5 is a plot of simultaneous multi-colored ASE spectra at 80 K from a multi-layer geometry nanocrystal-titania composite film. Insets show a diagrammatic representation of the multi-layer structure as well as the power dependence of the ASE peak as a function of excitation intensity, respectively. Also marked with arrows are the ASE thresholds for the layers.

Finally, the ease of preparing these films is exploited to produce more complicated wave-guide structures, in which two different, high-refractive index nanocrystal-titania layers are separated by a low-refractive index neat titania layer (inset FIG. 5). The presence of nanocrystals at such high volume fractions increases the refractive index of the neat titania film from ~1.6 to values as high as 1.8. FIG. 4 reproduces the optical response at 80 K of one such composite film, where one sees a characteristic sharpening of the PL spectra at two spectrally distinct regions (559 nm and 624 nm), each corresponding to one of the nanocrystal-titania layers used to build up the heterostructure. The inset in FIG. 5 shows the characteristic super-linear behavior at both ASE wavelengths as a function of the excitation intensity, and the ASE thresholds are marked with arrows. It is important to note that such simultaneous ASE behavior is not possible by simply mixing two different sized nanocrystal within the same layer for two reasons. First, mixing the different sized nanocrystal within the same layer reduces their individual volume fractions, below those necessary to observe ASE. Second, the nanocrystals have significant absorption cross-sections at energies higher than their band edge absorption state, a feature that is used to simultaneously pump these structures. Therefore, any gain presented by the smaller sized nanocrystal would be scavenged by absorption losses from the larger sized nanocrystal, resulting in ASE developing only at the longer wavelength. Spatially separating the two nanocrystal-titania layers reduces these absorption losses, as the wave-guided light is confined to the individual layer itself. The strength of the chemical approach of this report is clearly summarized by the ease with which these layered composites are created. Such a structure represents a bottom up approach to rebuilding a broadband gain composite material using individual narrow gain composites deposited sequentially in layers, but with the relative temperature insensitivity of the observed gain.

Other embodiments are within the scope of the following claims.

What is claimed is:

1. A composite comprising:
   a plurality of semiconductor nanocrystals incorporated in an inorganic matrix including titanium; and
   a coordinating ligand associated with the semiconductor nanocrystal;
   wherein the coordinating ligand has the formula

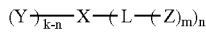

wherein k is 2,3 or 5, n is 1, 2, 3, 4 or 5, and m is 1 or 2, 3, 4, 5, 6, 7, 8, 9 or 10;
   X is O, S, S=O, $SO_2$, Se, Se=O, N, N=O, P, P=O, As, or As=O;
   each of Y and L, independently, is a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3–5 membered heterocycloalkyl, monocyclic aryl, 5–6 membered heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by –O–, –S–, –N($R^e$)–, –N($R^e$)–,–N($R^e$)–C(O)–O–, –O–C(O)–N($R^e$)–, –N($R^e$)–C(O)–N($R^f$)–, –O–C(O)–O–, –P($R^e$)–, or –P(O)($R^e$)–;
   each of $R^e$ and $R^f$, independently, is hydrogen, alkyl, alkenyl, alkynyl, alkoxy, hydroxylakyl, hydroxyl, or haloalkyl; and
   Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

2. The composite of claim 1, wherein the inorganic matrix includes a metal oxide.

3. The composite of claim 2, wherein the metal oxide is a titanium oxide, an aluminum oxide, a silicon oxide, a magnesium oxide, a boron oxide, a phosphorous oxide, a germanium oxide, an indium oxide, a tin oxide, a zirconium oxide, or a mixture thereof.

4. The composite of claim 1, wherein the semiconductor nanocrystal is a Group II-VI compound, a Group II-V compound, a Group III-VI compound, a Group III-V compound, a Group IV-VI compound, a Group I-III-VI compound, a Group II-IV-VI compound, or a Group II-IV-V compound.

5. The composite of claim 1, wherein the composite includes greater than 5% by volume semiconductor nanocrystals.

6. The composite of claim 1, wherein the plurality of nanocrystals form a monodisperse distribution of sizes.

7. The composite of claim 1, wherein the coordinating ligand includes a moiety that is compatible with, soluble within, or reacts with the matrix.

8. The composite of claim 1, wherein k is 3, n is 1, 2, or 3, and m is 1, 2, or 3, X is P or P=O; Y is $C_{1-6}$ alkyl, L is a straight or branched $C_{2-6}$ hydrocarbon chain, and Z is hydroxy, carboxyl, carboxylate, amine or amide.

9. The composite of claim 1, wherein the composite forms a gain medium, a waveguide, or a laser.

10. A waveguide comprising a plurality of layers, at least one layer containing a first semiconductor nanocrystal in a first metal oxide matrix and a coordinating ligand associated with the semiconductor nanocrystal;
    wherein the coordinating ligand has the formula

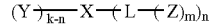

wherein k is 2, 3 or 5, n is 1, 2, 3, 4 or 5, and m is 1 or 2, 3, 4, 5, 6, 7, 8, 9 or 10;
    X is O, S, S=O, $SO_2$, Se, Se=O, N, N=O, P, P=O, As, or As=O;
    each of Y and L, independently, is a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3–5 membered heterocycloalkyl, monocyclic aryl, 5–6 membered heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by –O–, –S–, –N($R^e$)–C(O)–O–, –O–C(O)–N($R^e$)–, –N($R^e$)–C(O)–N($R^f$)–, –O–C(O)–O–, –P($R^e$)–, or –P(O)($R^e$)–;
    each of $R^e$ and $R^f$, independently, is hydrogen, alkyl, alkenyl, alkynyl, alkoxy, hydroxylakyl, hydroxyl, or haloalkyl; and
    Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

11. The waveguide of claim 10, further comprising a second layer including a second composite including a second semiconductor nanocrystal and having an index of refraction different from the index of refraction of the first metal oxide matrix.

12. The waveguide of claim 10, wherein the first metal oxide matrix is a titanium oxide, an aluminum oxide, a silicon oxide, a magnesium oxide, a boron oxide, a phosphorous oxide, a germanium oxide, an indium oxide, a tin oxide, a zirconium oxide, or a mixture thereof.

13. The waveguide of claim 11, wherein the second composite includes a titanium oxide, an aluminum oxide, a silicon oxide, a magnesium oxide, a boron oxide, a phosphorous oxide, a germanium oxide, an indium oxide, a tin oxide, a zirconium oxide, or a mixture thereof.

14. The waveguide of claim 10, wherein the semiconductor nanocrystal is a Group II-V compound, a Group II-V compound, a Group III-VI compound, a Group III-V compound, a Group IV-VI compound, a Group I-III-VI compound, a Group II-IV-VI compound, or a Group II-IV-V compound.

15. A method of manufacturing a composite comprising:
providing a semiconductor nanocrystal;
providing a matrix precursor;
contacting the semiconductor nanocrystal with a coordinating ligand that includes a moiety that is compatible with, soluble within, or reacts with a matrix; and
forming a solid including titanium from the precursor and the semiconductor nanocrystal;
wherein the coordinating ligand has the formula

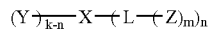

wherein k is 2, 3 or 5, n is 1, 2, 3, 4 or 5, and m is 1 or 2, 3, 4, 5, 6, 7, 8, 9 or 10;
X is O, S, S=O, SO$_2$, Se, Se=O, N, N=O, P, P=O, As, or As=O;
each of Y and L, independently, is a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3–5 membered heterocycloalkyl, monocyclic aryl, 5–6 membered heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by –O–, –S–, –N(R$^e$)–, –N(R$^e$)–C(O)–O–, –O–C(O)–N(R$^e$)–, –N(R$^e$)–C(O)–N(R$^f$)–, –O–C(O)–O–, –P(R$^e$)–, or –P(O)(R$^e$)–;
each of R$^e$ and R$^f$, independently, is hydrogen, alkyl, alkenyl, alkynyl, alkoxy, hydroxylakyl, hydroxyl, or haloalkyl; and
Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

16. The method of claim 15, wherein the precursor is a metal halide or a metal alkoxide.

17. The method of claim 15, wherein the precursor is a titanium alkoxide, an aluminum alkoxide, a silicon alkoxide, an magnesium alkoxide, a boron alkoxide, a phosphorous alkoxide, a germanium alkoxide, an indium alkoxide, a tin alkoxide, a zirconium alkoxide, or a mixture thereof.

18. The method of claim 15, wherein forming the solid includes coating the precursor and semiconductor nanocrystal on a substrate.

19. The method of claim 15, wherein k is 3, n is 1, 2, or 3, and m is 1, 2, or 3, X is P or P=O; Y is C$_{1-6}$ alkyl, L is straight or branched C$_{2-6}$ hydrocarbon chain, and Z is hydroxy, carboxyl, carboxylate, amine, or amide.

20. A composite comprising:
a plurality of semiconductor nanocrystals in an inorganic matrix, wherein a semiconductor nanocrystal of the plurality includes a core including a first semiconductor material and an overcoating including a second semiconductor material on a surface of the core; and
a coordinating ligand associated with the semiconductor nanocrystal;
wherein the coordinating ligand has the formula

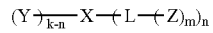

wherein k is 2, 3 or 5, n is 1, 2, 3, 4 or 5, and m is 1 or 2, 3, 4, 5, 6, 7, 8, 9 or 10;
X is O, S, S=O, SO$_2$, Se, Se=O, N, N=O, P, P=O, As, or As=O;
each of Y and L, independently, is a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3–5 membered heterocycloalkyl, monocyclic aryl, 5–6 membered heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by –O–, –S–, –N(R+$^\circ$)–, –N(R$^e$)–C(O)–O–, –O–C(O)–N(R$^e$)–, –N(R$^e$)–C(O)–N(R$^f$)–, –O–C(O)–O–, –P(R$^e$)–, or –P(O)(R$^e$)–;
each of R$^e$ and R$^f$, independently, is hydrogen, alkyl, alkenyl, alkynyl, alkoxy, hydroxylakyl, hydroxyl, or haloalkyl; and
Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

21. The composite of claim 20, wherein the inorganic matrix includes a metal oxide.

22. The composite of claim 21, wherein the metal oxide is a titanium oxide, an aluminum oxide, a silicon oxide, a magnesium oxide, a boron oxide, a phosphorous oxide, a germanium oxide, an indium oxide, a tin oxide, a zirconium oxide, or a mixture thereof.

23. The composite of claim 20, wherein the first semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

24. The composite of claim 23, wherein the second semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

25. The composite of claim 20, wherein the composite includes greater than 5% by volume semiconductor nanocrystals.

26. The composite of claim 20, wherein the plurality of nanocrystals form a monodisperse distribution of sizes.

27. The composite of claim 20, wherein the coordinating ligand includes a moiety that is compatible with, soluble within, or reacts with the matrix.

28. The composite of claim 20, wherein k is 3, n is 1, 2, or 3, and m is 1, 2, or 3, is P or P=O; Y is C$_{1-6}$ alkyl, L is a straight or branched C$_{2-6}$ hydrocarbon chain, and Z is hydroxy, carboxyl, carboxylate, amine, or amide.

29. The composite of claim 20, wherein the composite forms a gain medium, a waveguide, or a laser.

30. A waveguide comprising a plurality of layers, at least one layer containing a first semiconductor nanocrystal in a first metal oxide matrix and a coordinating ligand associated with the first semiconductor nanocrystal, wherein the first semiconductor nanocrystal includes a core including a first semiconductor material and an overcoating including a second semiconductor material on a surface of the core;

wherein the coordinating ligand has the formula

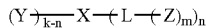

wherein k is 2, 3 or 5, n is 1, 2, 3, 4 or 5, and m is 1 or 2, 3, 4, 5, 6, 7, 8, 9 or 10;

X is O, S, S=O, $SO_2$, Se, Se=O, N, N=O, P, P=O, As, or As=O;

each of Y and L, independently, is a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$cycloalkyl, 3–5 membered heterocycloalkyl, monocyclic aryl, 5–6 membered heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by –O–, –S–, –N($R^e$)–, –N($R^e$)–C(O)–O–, –O–C(O)–N($R^e$)–, –N($R^e$)–C(O)–N($R^f$)–, –O–C(O)–O–, –P($R^e$)–, or –P(O)($R^e$)–;

each of $R^e$ and $R^f$, independently, is hydrogen, alkyl, alkenyl, alkynyl, alkoxy, hydroxylakyl, hydroxyl, or haloalkyl; and Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

31. The waveguide of claim 30, further comprising a second layer including a second composite including a second semiconductor nanocrystal and having an index of refraction different from the index of refraction of the first metal oxide matrix.

32. The waveguide of claim 30, wherein the first metal oxide matrix is a titanium oxide, an aluminum oxide, a silicon oxide, a magnesium oxide, a boron oxide, a phosphorous oxide, a germanium oxide, an indium oxide, a tin oxide, a zirconium oxide, or a mixture thereof.

33. The waveguide of claim 31, wherein the second composite includes a titanium oxide, an aluminum oxide, a silicon oxide, a magnesium oxide, a boron oxide, a phosphorous oxide, a germanium oxide, an indium oxide, a tin oxide, a zirconium oxide, or a mixture thereof.

34. The waveguide of claim 30, wherein the first semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

35. The waveguide of claim 34, wherein the second semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

36. A method of manufacturing a composite comprising:
providing a semiconductor nanocrystal including a core including a first semiconductor material and an overcoating including a second semiconductor material on a surface of the core;
providing a matrix precursor;
contacting the semiconductor nanocrystal with a coordinating ligand that includes a moiety that is compatible with, soluble within, or reacts with a matrix;
contacting the semiconductor nanocrystal with a precursor of the matrix; and
forming a solid from the precursor and the semiconductor nanocrystal;
wherein the coordinating ligand has the formula

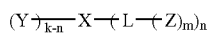

wherein k is 2, 3 or 5, n is 1, 2, 3, 4 or 5, and m is 1 or 2, 3, 4, 5, 6, 7, 8, 9 or 10;

X is O, S, S=O, $SO_2$, Se, Se=O, N, N=O, P, P=O, As, or As=O;

each of Y and L, independently, is a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$cycloalkyl, 3–5 membered heterocycloalkyl, monocyclic aryl, 5–6 membered heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by –O–, –S–, –N($R^e$)–, –N($R^e$)–C(O)–O–, –O–C(O)–N($R^e$)–, –N($R^e$)–C(O)–N($R^f$)–, –O–C(O)–O–, –P($R^e$)–, or –P(O)($R^e$)–;

each of $R^e$ and $R^f$, independently, is hydrogen, alkyl, alkenyl, alkynyl, alkoxy, hydroxylakyl, hydroxyl, or haloalkyl; and Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

37. The method of claim 36, wherein the precursor is a metal halide or a metal alkoxide.

38. The method of claim 36, wherein the precursor is a titanium alkoxide, an aluminum alkoxide, a silicon alkoxide, a magnesium alkoxide, a boron alkoxide, a phosphorous alkoxide, a germanium alkoxide, an indium alkoxide, a tin alkoxide, a zirconium alkoxide, or a mixture thereof.

39. The method of claim 36, wherein forming the solid includes coating the precursor and semiconductor nanocrystal on a substrate.

40. The method of claim 36, wherein k is 3, n is 1, 2, or 3, and m is 1, 2, or 3, X is P or P=O; Y is $C_{1-6}$ alkyl, L is a straight or branched $C_{2-6}$ hydrocarbon chain, and Z is hydroxy, carboxyl, carboxylate, amine, or amide.

41. The method of claim 36, wherein the first semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

42. The method of claim 41, wherein the second semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

43. A method of manufacturing a composite comprising:
providing a semiconductor nanocrystal;
providing a matrix precursor;
contacting the semiconductor nanocrystal with a coordinating ligand that includes a moiety that is compatible with, soluble within, or reacts with a matrix;
contacting the semiconductor nanocrystal with a precursor of the matrix; and
forming a solid from the precursor and the semiconductor nanocrystal; wherein the precursor is a metal halide or a metal alkoxide;
wherein the coordinating ligand has the formula

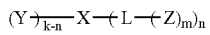

wherein k is 2, 3 or 5, n is 1, 2, 3, 4 or 5, and m is 1 or 2, 3, 4, 5, 6, 7, 8, 9 or 10;
X is O, S, S=O, $SO_2$, Se, Se=O, N, N=O, P, P=O, As, or As=O;
each of Y and L, independently, is a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$cycloalkyl, 3–5 membered heterocycloalkyl, monocyclic aryl, 5–6 membered heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by –O–, –S–, –N($R^e$)–, –N($R^e$)–C(O)–O–, –O–C(O)–N($R^e$)–, –N($R^e$)–C(O)–N($R^f$)–, –O–C(O)–O–, –P($R^e$)–, or –P(O)($R^e$)–;
each of $R^e$ and $R^f$, independently, is hydrogen, alkyl, alkenyl, alkynyl, alkoxy, hydroxylakyl, hydroxyl, or haloalkyl; and
Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

44. A method of manufacturing a composite comprising:
providing a semiconductor nanocrystal;
providing a matrix precursor;
contacting the semiconductor nanocrystal with a coordinating ligand that includes a moiety that is compatible with, soluble within, or reacts with a matrix;
contacting the semiconductor nanocrystal with a precursor of the matrix; and
forming a solid from the precursor and the semiconductor nanocrystal; wherein the precursor is a titanium alkoxide, an aluminum alkoxide, a silicon alkoxide, a magnesium alkoxide, a boron alkoxide, a phosphorous alkoxide, a germanium alkoxide, an indium alkoxide, a tin alkoxide, a zirconium alkoxide, or a mixture thereof;
wherein the coordinating ligand has the formula

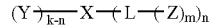

wherein k is 2, 3 or 5, n is 1, 2, 3, 4 or 5, and m is 1 or 2, 3, 4, 5, 6, 7, 8, 9 or 10;
X is O, S, S=O, $SO_2$, Se, Se=O, N, N=O, P, P=O, As, or As=O;
each of Y and L, independently, is a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$cycloalkyl, 3–5 membered heterocycloalkyl, monocyclic aryl, 5–6 membered heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by –O–, –S–, –N($R^e$)–, –N($R^e$)–C(O)–O–, –O–C(O)–N($R^e$)–, –N($R^e$)–C(O)–N($R^f$)–, –O–C(O)–O–, –P($R^e$)–, or –P(O)($R^e$)–;
each of $R^e$ and $R^f$, independently, is hydrogen, alkyl, alkenyl, alkynyl, alkoxy, hydroxylakyl, hydroxyl, or haloalkyl; and
Z is hydroxy, sulfhydryl, sulfinate, sulfinic acid, sulfonate, sulfonic acid, disulphide, carboxyl, carboxylate, amine, amide, alkoxysilyl, halosilyl, phosphate, phosphonic acid, phosphonate ester, phosphinate, phosphinic acid, or phosphinate ester.

* * * * *